US006379571B1

(12) United States Patent
Kobayashi et al.

(10) Patent No.: US 6,379,571 B1
(45) Date of Patent: Apr. 30, 2002

(54) ETCHING METHOD FOR PROCESSING SUBSTRATE, DRY ETCHING METHOD FOR POLYETHERAMIDE RESIN LAYER, PRODUCTION METHOD OF INK-JET PRINTING HEAD, INK-JET HEAD AND INK-JET PRINTING APPARATUS

(75) Inventors: Junichi Kobayashi, Ayase; Norio Ohkuma, Machida; Keiichi Murakami, Hachioji; Tamaki Sato, Kawasaki, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/329,357

(22) Filed: Jun. 10, 1999

(30) Foreign Application Priority Data

Jun. 11, 1998 (JP) .......................................... 10-163940

(51) Int. Cl.$^{7}$ ............................................ H01L 21/302

(52) U.S. Cl. ............................ 216/27; 216/41; 216/49; 216/67; 216/79

(58) Field of Search ............................. 216/27, 41, 47, 216/49, 67, 69, 79, 2

(56) References Cited

U.S. PATENT DOCUMENTS 4,392,907 A * 7/1983 Shirato et al. .............. 156/252
4,688,054 A * 8/1987 Inamoto et al. ............. 346/140
5,478,606 A 12/1995 Ohkuma et al. ............ 427/555

FOREIGN PATENT DOCUMENTS

EP 0521517 A2 * 1/1993 .............. B41J/2/16
EP 0 827 032 A2 3/1998
EP 0 841 167 A2 5/1998
EP 0 962 320 A1 12/1999
JP 56043728 * 4/1981 .................. 438/99
JP 60131536 * 7/1985 ................. 101/456
JP 07202114 * 8/1995 ........... H01L/23/50
JP 08267763 * 10/1996 .............. B41J/2/16
JP 09001806 * 1/1997 .............. B41J/2/05

OTHER PUBLICATIONS

Patent Abstracts of Japan, vol. 011, No. 329 (E–552), Oct. 27, 1987 (with respect to JP 62–117331 A of May 28, 1987).
Patent Abstracts of Japan, vol. 005, No. 099 (E–063), Jun. 26, 1981) (with respect to JP 56–043728 A of Apr. 22, 1981).

* cited by examiner

*Primary Examiner*—Randy Gulakowski
*Assistant Examiner*—Jiri Smetana
(74) *Attorney, Agent, or Firm*—Fitzpatrick, Cella, Harper & Scinto

(57) ABSTRACT

An ink-jet head is produced by means of an etching employing a mask member which is formed without defects such as pinholes. More specifically, a polyetheramide resin layer is employed as an etching-resistance mask when processing a substrate by means of the etching, in which the polyetheramide resin layer is etched by means of an etching gas containing oxygen as main component.

31 Claims, 11 Drawing Sheets

ETCHING METHOD FOR PROCESSING SUBSTRATE, DRY ETCHING METHOD FOR POLYETHERAMIDE RESIN LAYER, PRODUCTION METHOD OF INK-JET PRINTING HEAD, INK-JET HEAD AND INK-JET PRINTING APPARATUS

This application is based on Patent Application No. 10-163940 (1998) filed Jun. 11, 1998 in Japan, the content of which is incorporated hereinto by reference.

BACKGROUND OF THE INVENTION

1. Field of the Invention

The present invention relates to an etching method for processing a substrate and a dry etching method for a polyetheramide resin layer. More specifically, the present invention relates to a silicon-anisotropic etching method used in micro-machining techniques such as formation of an ink supply port in an ink-jet head or a pressure sensor, or to a dry etching method suitable for etching a protective film as an ink-resistant layer in an ink-jet printing head or a protective film of a semiconductor device.

2. Description of the Prior Art

As an etching method used in micro-machining, a chemical etching technology based on a photolithography is presently a mainstream technology. A silicon (herein after, also called "Si" simply) substrate (wafer) having a surface whose crystal plane orientation is of <100> plane, or of <110> plane is generally used as a substrate subjected to the above-stated chemical etching. Employing the Si substrate having such plane orientations for performing an alkaline chemical etching to that substrate causes selectivity with respect to etching progression to be shown in respective depth (dig-in) and width (spread) directions, thereby, an anisotropy of etching can be obtained. For example, this anisotropy of etching allows a hole having a large depth and a small width to be formed. Further, in the case of employing the substrate having the crystal plane orientation of <100> plane for etching, the etching progression in the depth direction can be controlled because geometry in the depth direction is determined depending on an etching width. For example, a hole having a configuration, which becomes narrower in the depth direction at an angle of 54.7° from an etching starting plane can be obtained. Therefore, careful determining of a substrate thickness and an etching width allows a control of the formation of a hole which elongates halfway in the substrate thickness to be performed positively and easily without causing the hole to pass through the substrate (see FIG. 4).

It has been well known that the above-described etching characteristic is applied in micro-machining techniques such as production of an ink-jet head, a pressure sensor and the like.

A chemical etching employing an alkaline etching solution is performed by generally using strong alkali solution for an extended etching time and heat treatment is also performed during the etching. Considering such etching conditions, a dielectric film such as $SiO_2$, SiN or the like is generally used as an etching-resistant mask.

However, since these films are generally formed as deposition films made by sputtering or CVD, it is difficult to form these films without defects, which defective part (pinhole) may lead to a malfunction in the head or the like. Further, machining is becoming finer in structure year by year, small defects become what can not be disregarded.

As described above, in the micro-machining technology such as the head production, it is a strong demand to form a defectless etching mask.

SUMMARY OF THE INVENTION

The object of the present invention is to provide an etching method capable of using a mask material which has an alkali resistance and does not generate defects such as pinholes and performing reliable etching, a production method of an ink-jet printing head using the above method, an ink-jet head and an ink-jet printing apparatus.

In the first aspect of the present invention, there is provided an etching method in which an etching-resistant mask having a predetermined opening pattern is provided on a substrate and etching is performed through said etching-resistant mask so as to process said substrate, wherein a polyetheramide resin layer is used as said etching-resistant mask.

In the second aspect of the present invention, there is provided a dry etching method for a polyetheramide resin layer, wherein said polyetheramide resin layer is etched by means of an etching gas containing oxygen as a main component.

In the third aspect of the present invention, there is provided a dry etching method for a polyetheramide resin layer, wherein said polyetheramide resin layer is etched by means of an etching gas containing oxygen and carbon tetrafluoride as main components.

In the fourth aspect of the present invention, there is provided a production method of producing an ink-jet head for ejecting an ink, comprising the steps of:

preparing a substrate for constructing said ink-jet head;

forming a mask pattern including a polyetheramide resin layer on a surface of said substrate; and performing etching with use of said mask pattern as a mask.

In the fifth method of producing an ink-jet head for ejecting an ink, comprising the steps of:

preparing a substrate for constructing said ink-jet head;

forming a mask pattern including a two-layered structure of a polyetheramide resin layer formed on a dielectric layer, said two layered structure being formed on a surface of said substrate; and performing etching with use of said mask pattern as a mask.

In the sixth aspect of the present invention, there is provided an ink-jet head for ejecting ink, said ink-jet head being produced by a production method comprising the steps of:

preparing a substrate for constructing the ink-jet head;

forming a mask pattern including a polyetheramide resin layer on a surface of said substrate; and performing etching with use of said mask pattern as a mask.

In the seventh aspect of the present invention, there is provided an ink-jet head for ejecting ink, said ink-jet head being produced by a production method comprising the steps of:

preparing a substrate for constructing the ink-jet head;

forming a mask pattern including a two-layered structure in which a polyetheramide layer is formed on a dielectric layer; and performing etching with use of said mask pattern as a mask.

A polyether amide resin used in the present invention is a material which has a high strength and flexibility to have a high absorbing effect to an external stress, has high chemical resistance not to be affected by acids, alkalis, aromatic solvents and the like, and has high heat resistance and high moisture resistance to be dissolved in a polar solvent to become a varnish which form a film at relatively low temperature at which a solvent only evaporates. Therefore, a layer made with the polyether amide resin can be used as a mask for etching a substrate constructing an ink-jet head to reduce defects such as pinholes generated in the mask during formation of the mask.

In the present invention, a two-layered structure in which the polyetheramide layer is formed on a dielectric layer can be employed to allow the above defects to be reduced and etching with a good accuracy to be performed in, for example, an anisotropic etching.

Further, since the polyetheramide resin has not a photosensitivity by itself, a dispenser or a screen-printing is used in general when performing patterning on the resin. Therefore, the polyetheramide resin has been used in applications which do not require fine patterning, such as a moisture-proof coating for electronic parts, but has been difficult to be used in an application which require the fine patterning, such as an etching mask used in the micro machining technique or a protective film or the like as an ink-resistant layer in an ink-jet printing head. If an attempt is made to employ a method of coating the polyetheramide resin with an etching mask and of dissolving an unnecessary part of the mask, an appropriate masking material has not been available which has resistance to a solvent that can dissolve the polyetheramide resin. However, the dry etching method for the polyetheramide resin layer according to the present invention allows such fine patterning so that the polyetheramide resin layer can be used for a protective film or the like as an ink-resistant layer in the ink-jet printing head in which the fine patterning is required for the protective film.

The above and other objects, effects, features and advantages of the present invention will become more apparent from the following description of embodiments thereof taken in conjunction with the accompanying drawings.

BRIEF DESCRIPTION OF THE DRAWINGS

FIGS. 1A to 1D are views showing a construction of an ink-jet head according to a first embodiment of the present invention, wherein FIG. 1B is a sectional view at a line A–A' in FIG. 1A, FIG. 1C is a schematic plane view showing a Si substrate part of the ink-jet head, and FIG. 1D is a schematic sectional view showing the Si substrate part;

DETAILED DESCRIPTION OF THE PREFERRED EMBODIMENTS

In the following, preferred embodiments of the present invention will be described with reference to the drawings.

Embodiment 1

Figure 1A:
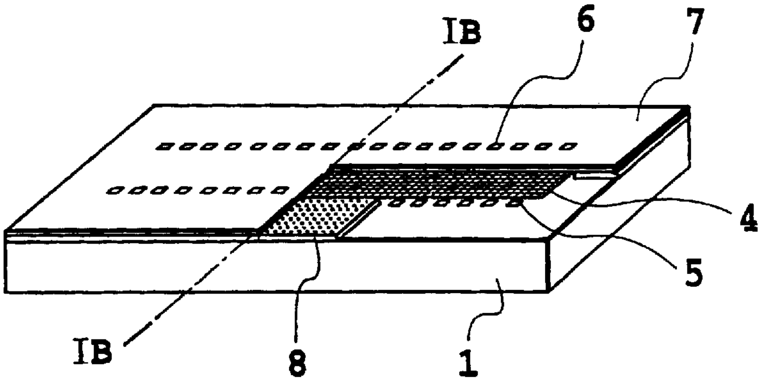
Figure 1B:
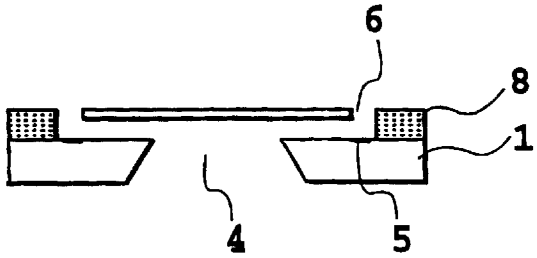
Figure 1C:
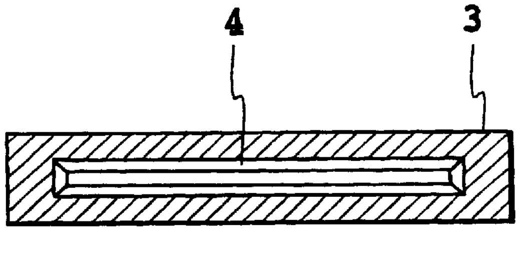
Figure 1D:
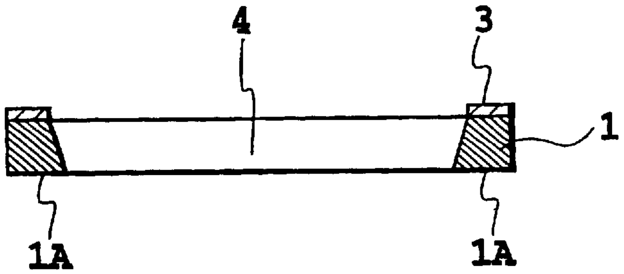

FIGS. 1A to 1D are views showing a construction of an ink-jet head according to a first embodiment of the present invention. FIG. 1B is a sectional view at a line IB—IB in FIG. 1A, FIG. 1C is a schematic plane view showing a Si substrate part of the ink-jet head, and FIG. 1D is a schematic sectional view showing the Si substrate part.

As shown in FIGS. 1A and 1B, the ink-jet head has an ejection opening plate 7 provided with ejection openings 6 which are arranged corresponding to electro-thermal conversion elements 5 and an ink supply port 4 opened in a Si substrate 1 for supplying ink from a back surface side of the Si substrate 1, and thus has a side shooter type ink-jet head construction which ejects ink in a direction nearly perpendicular to the surface of the substrate.

As shown in FIGS. 1C and 1D, on one side of a substrate surface 1A of the substrate 1, the electro-thermal conversion element (shown in FIGS. 1A and 1B) for generating thermal energy utilized for ink ejection and a member 8 (shown in FIGS. 1A and 1B) for forming an ink flow passage are formed. Further, an ink supply port 4 as a through-hole is formed at the center of the substrate 1 so that ink can be supplied to the above-stated ink flow passage at the surface 1A side from the back surface of the substrate 1. In the same figure, a reference numeral 3 denotes a poyetheramide resin layer for a mask pattern formed in the production process shown below.

Figure 2A:
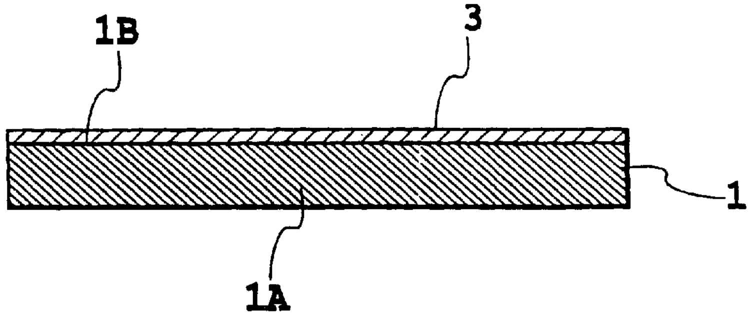
FIGS. 2A to 2C are schematic diagrams showing a production process of the ink-jet head according to the first embodiment of the present invention.
Figure 2B:
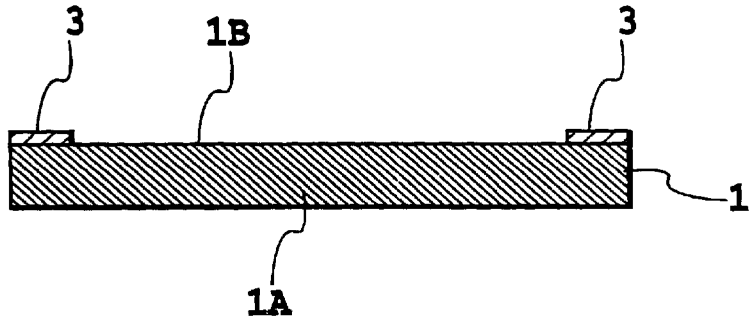
Figure 2C:
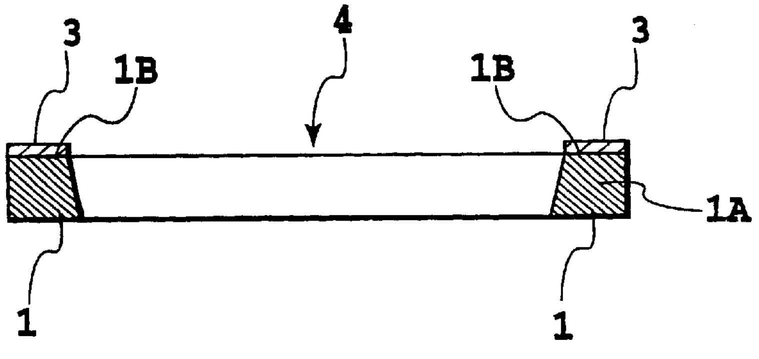

FIGS. 2A to 2C are schematic diagrams illustrating art of a production process for the ink-jet head according to the present embodiment.

As shown in FIG. 2A, the Si substrate 1 of a <100> plane is used and a polyetheramide resin layer 3 is formed by means of a spin coating on an etching starting surface 1B side of the substrate 1, at first.

In the present embodiment, a thermoplastic polyetheramide (manufactured by Hitachi Kasei Kogyo, trade name: HL-1200) is used as the polyetheramide resin layer 3. The above-stated thermoplastic polyetheramide is available as a solution dissolved in a solvent. The solution can be spin coated with a predetermined film thickness and then a solvent component is removed by heat drying so that the thermoplastic polyetheramide resin layer 3 is formed. Here, as to setting of the film thickness to be coated, it has been confirmed from experiments conducted by the inventors that a film thickness of 2 μm or more is effective in view of obtaining a defectless etching mask which is an object of the present invention, because there is noted a correlation between the film thickness and a defect generation rate.

Next, as shown in FIG. 2B, forming an etching mask pattern of the thermoplastic polyetheramide resin layer 3 is performed. The pattern is formed as follows. When a thermoplastic polyetheramide stated in the present embodiment is used as a material for the resin layer 3, since this material is not provided with a photosensitive component, at first, a resist pattern (not shown) is formed separately by means of a photolithography using a photo-resist to form a pattern of the thermoplastic polyetheramide.

Then, by using the resist pattern, etching on the thermoplastic polyetheramide is performed so that the etching mask shown in FIG. 2B is formed. In this case, etching on the thermoplastic polyetheramide may be achieved by using a solvent such as dimethylformamide, dimethylsulfoxide, N-methyl pyrrolidone or the like, and the photo-resist as a mask material which is used during dissolution removal by means of the above-stated solvent may be required to have a solvent resistance.

For this reason, in the present embodiment, a dry etching by means of a reactive gas is employed rather than employing the solvent, in view of a solvent resistance of the mask to the above-stated solvent. As the reactive gas, RIE (reactive ion etching) using $O_2$ gas or plasma etching may be employed.

In the dry etching using the reactive gas, since the photo-resist used as the mask and thermoplastic polyetheramide are etched at nearly the same rate, there is not caused a problem when the film thickness of the photo-resist is more than two times as that of the film thickness of the thermoplastic polyetheramide.

After etching on the thermoplastic polyetheramide 3 with a predetermined pattern, the photo-resist can be removed to obtain the state as shown in FIG. 2B.

Next, as shown in FIG. 2C, the supply port 4 is formed by means of the anisotropic etching using the thermoplastic polyetheramide resin film 3 as a mask.

In the anisotropic etching, a solution of KOH, NaOH, TMAH or the like can be used as an alkaline etching solution, and there is a correlation between a concentration of the solution, a treatment temperature, an etching rate and a flatness of etched surface. Therefor, in the present embodiment, the etching is performed with use of 22 wt % TMAH at the treatment temperature of 80° C. The etching rate in this case is about 30 μm/h to 40 μm/h.

Further, in the case that the etching solution contacts with the surface opposite to the etching starting surface of the substrate 1 to be etched during etching and causes a problem, the above thermoplastic polyetheramide as a protection may be coated on the entire surface or a tool may be used to prevent the etching solution from contacting.

The thermoplastic polyetheramide as the resin layer 3 used for the etching mask is removed after the completion of the anisotropic etching as necessary. As a removal means, similarly to the method used for pattern formation of the above thermoplastic polyetheramide, a solvent or dry etching method may be used.

As described above, by employing the thermoplastic polyetheramide resin layer as the etching-resistant mask for the anisotropic etching, the ink-jet head can be formed at a relatively low cost and with a simple process.

It should be noted that the process subsequent to the production process of the ink-jet head shown in FIGS. 2A to 2C can be a conventional one known in the art, thereby completing the ink-jet head. Therefor, detailed description thereof is omitted. Further, the head of the present embodiment is of a so-called side shooter type which ejects ink in a direction perpendicular to the substrate 1.

Embodiment 2

A second embodiment of the present invention provides a construction effective for reducing defects in etching mask.

Figure 3A:
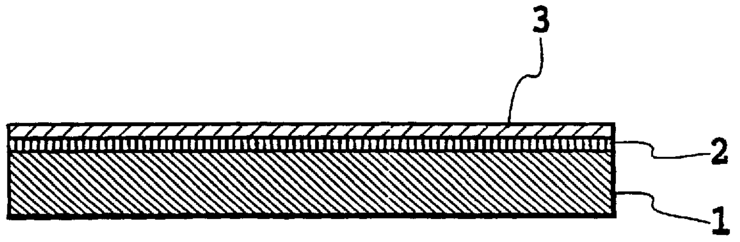
FIGS. 3A to 3C are schematic diagrams showing a production process of an ink-jet head according to a second embodiment of the present invention.
Figure 3B:
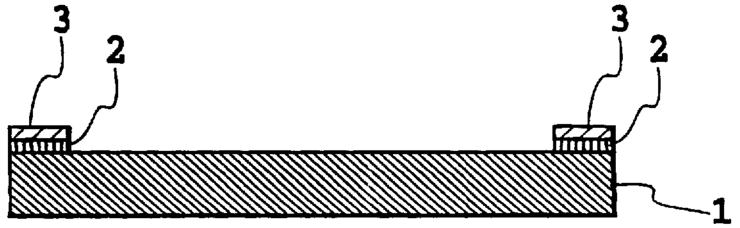
Figure 3C:
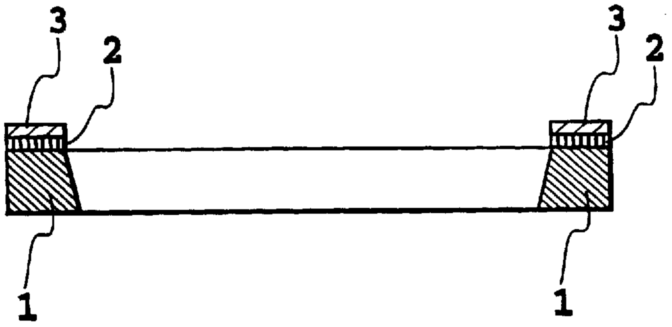
Figure 4:
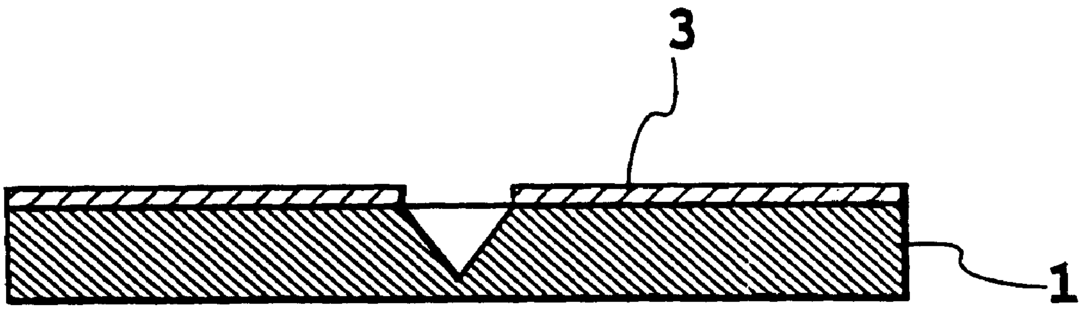
FIG. 4 is a schematic sectional diagram showing an example of an anisotropic etching in which a processed hole can be prevented from passing through the substrate.

Specifically, as shown in FIGS. 3A to 3C, an etching mask is formed of a two-layered structure having a dielectric layer 2 and a polyetheramide resin layer 3. By nature, the dielectric film 2 is reliable and thus used as an etching-resistant mask for the anisotropic etching in general. However, as described above, it is relatively difficult to form the dielectric layer 2 over the entire surface of the substrate 1 without causing the defect. For this reason, the present embodiment employs the above-described two-layered structure.

As shown in FIG. 3A, a film of $SiO_2$ or SiN is formed on an entire surface of the Si substrate 1 as the dielectric film 2, and thereon, the polyetheramide resin layer 3 is formed similarly to Embodiment 1. A thermoplastic polyetherpolyamide is used for the polyetheramide resin layer 3 and a necessary pattern is formed similarly to Embodiment 1. Then, the dielectric film 2 is etched with use of the pattern as a mask. As an etching method for the dielectric film 2, a method of using a mixture of hydrofluoric acid and ammonium fluoride as a conventional method known in the art or a dry etching method using a reactive gas may be used.

Further, in the present embodiment, the thermoplastic polyetheramide pattern functions as the etching mask for both the etching for the dielectric film and the anisotropic etching. However, depending on a process used, it may be also possible to set the respective pattern formations of the dielectric layer and thermoplastic polyetheramide as separate processes. Such a case is effective when there is any possibility that the thermoplastic polyetheramide is damaged by the etching solution used for the dielectric film.

As described above, a combination of the dielectric film advantageous in an adhesion of the Si substrate and in a resistance to the anisotropic etching solution with an organic resin which makes up for the defects of the dielectric film can provide an etching method which realize the pattern with high accuracy and high yield rate.

Figure 5:
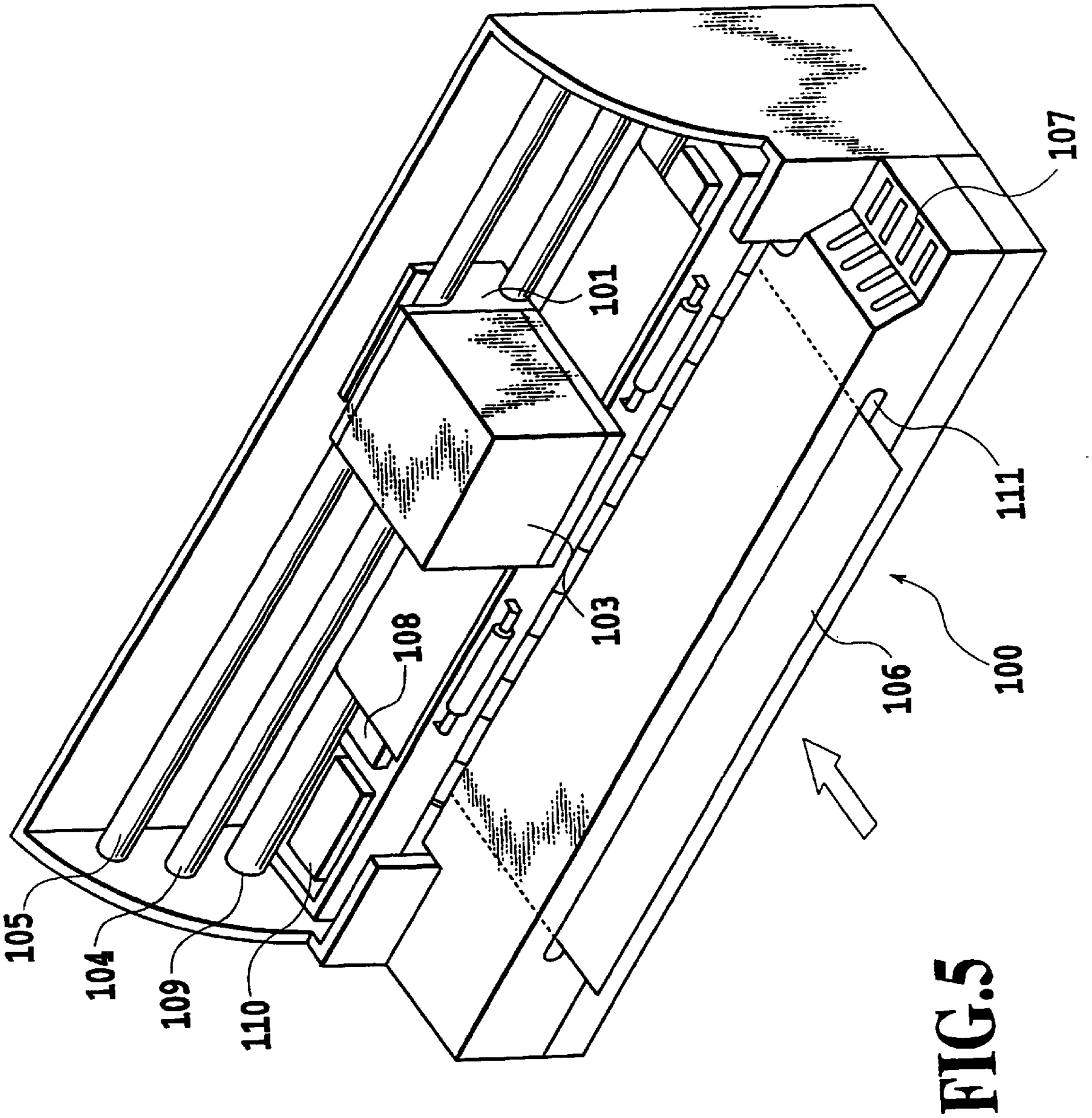
FIG. 5 is a schematic perspective view showing an example of an ink-jet printing apparatus capable of using the ink-jet head produced in the second embodiment of the present invention.

FIG. 5 is a schematic perspective view showing an ink-jet printing apparatus capable of using the ink-jet head obtained in the present embodiment.

In an ink-jet printing apparatus 100, a carriage 101 slidably engages with two guide shafts 104 and 105 extending in parallel to each other. This allows the carriage 101 to move along the guide shafts 104 and 105 by means of a drive motor and a driving force transmission mechanism for transmitting the driving force generated by the drive motor (both not shown). An ink-jet unit 103 having the ink-jet head and an ink tank as an ink vessel for containing the ink used for the head is mounted on the carriage 101.

The ink-jet unit 103 comprises the ink-jet head for ejecting the ink and the tank as a vessel for containing the ink supplied to the ink-jet head. More specifically, four heads respectively for ejecting black (Bk), cyan (C), magenta (M) and yellow (Y) inks and tanks provided corresponding to these inks are mounted as the ink-jet unit 103 on the carriage 101. The respective heads and tanks are detachable from each other so that only the tank of each ink color can be replaced as necessary such as when ink in a tank is exhausted or the like. Further, it is of course that only the head can be replaced as necessary. It is needless to say that a manner of attachment and detachment of the heads and tanks is not limited to the above example, but may be a manner in which the head and the tank are integrally formed and this integrated head and tank are exchanged.

A paper 106 as a printing medium is inserted from an insertion port 111 provided at the front end part of the apparatus, and finally its transportation direction is reversed to be transported by a feed roller 109 to a lower part of a moving area of the carriage 101. This operation allows printing to be made in the printing area on the paper 106 supported by a platen 108 by means of the head mounted on the carriage 101 in association with a movement of the carriage.

As described above, printing in which a width of a printed area corresponds to a length of ejection opening arrangement on the head and the area is formed in association with the movement of the carriage 101 and feeding the paper 106, are repeated in alternative manner so as to make printing for the entire paper 106 completed. Then, the paper 106 is discharged to a front of the apparatus.

At a left end of a movable area of the carriage 101 and at a lower position of the area, a recovery system unit 110 which can face each head on the carriage 101 are provided. This arrangement allows operations such as capping of the ejection openings of each head at non-printing and sucking ink through the ejection openings of each head to be performed. Further, this left end predetermined position is set as a home position of the head.

At a right end of the apparatus, on the other hand, an operations part 107 provided with switches and display devices is provided. The switches in this part are used for turning on/off of the apparatus power source and setting of various print modes, and the display devices serve to display various states of the apparatus.

Embodiment 3

Further preferred embodiments applied with a dry etching method for a polyetheramide resin according to the present invention will be described below.

Figure 11:
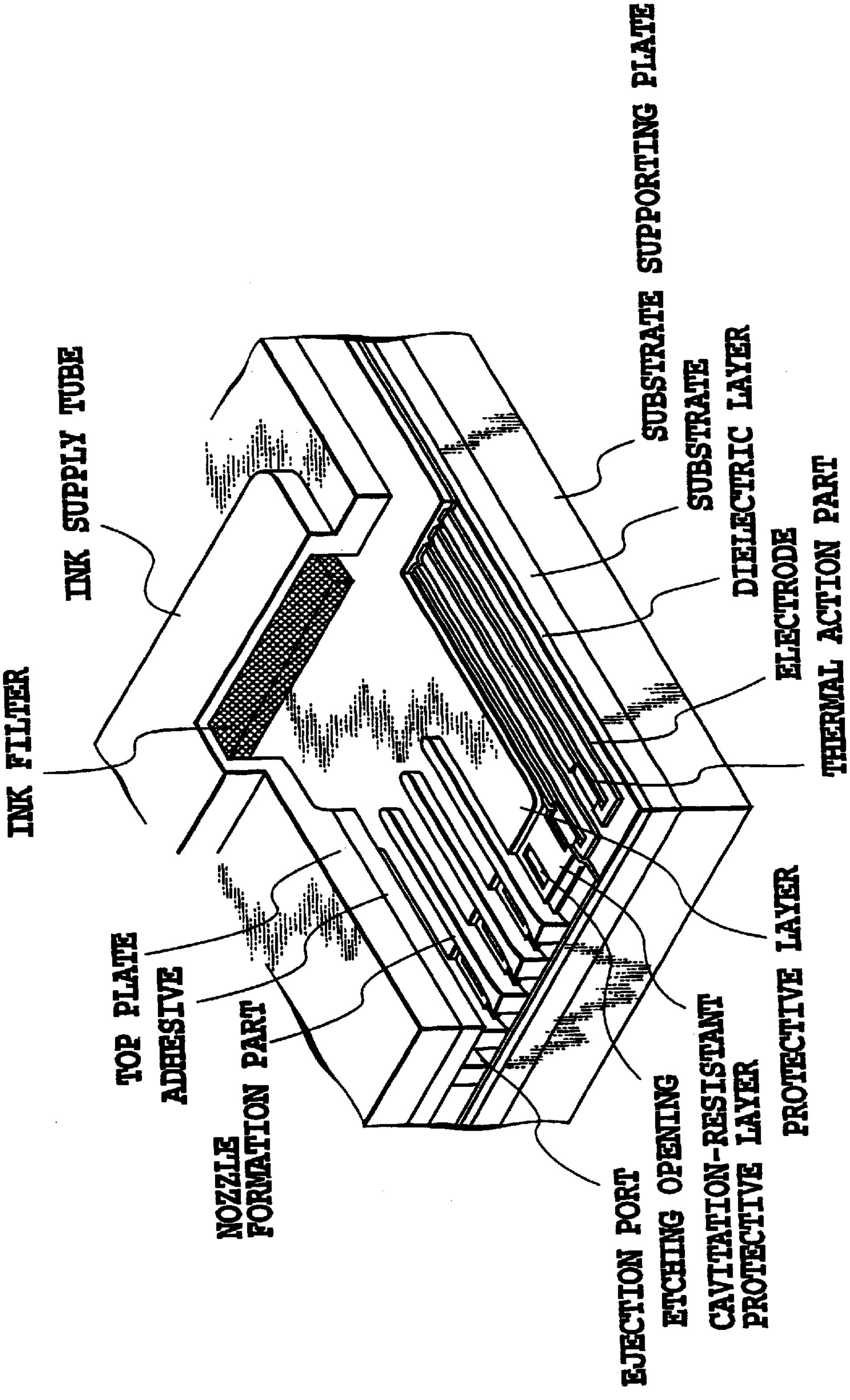
FIG. 11 is a partial sectional view showing an ink-jet head for explaining the construction of a protective layer as an ink-resistant layer in the present invention.

The polyetheramide resin is used for a protective film as an ink-resistant layer in the ink-jet head, for example, as a protective layer formed on a substrate including a thermal effect part in the ink-jet head as shown in FIG. 11. When forming an opening in the protective layer on the thermal effect part by means of etching, a residue caused due to etching may exist on a cavitation-resistant layer defining the thermal effect part. As a result of this, unstable bubble generation or variation in ejection amount occurs to cause an adverse effect on the ejection performance of the ink-jet printing head. Above all, in a recent ink-jet printing head which aims at improving printing quality by ejecting fine liquid drops, even the fine residue which is not so important for decreasing the printing quality in the past becomes unnegligible factor.

In general dry etching method, an etching rate is small and then a throughput is not so high. On the other hand, in the case of increasing a substrate temperature to increase the etching rate, other problems occur in which the resist is changed in a quality by heat for increasing the substrate temperature and the resist become hard to be removed. In particular, in such dry etching, a thin film-formed as a residue is formed on an etching surface and an etching or a removing liquid cannot remove the residue. Therefor, the dry etching method is not suited to be adopted as it is, as the etching method for the protective layer in the ink-jet head which is required to be suited for fine structured machining and even further improved print quality.

On the other hand, according to the dry etching method for the polyetheramide resin of the present embodiment, which performs etching by means of an etching gas mainly including a mixture of oxygen and carbon tetrafluoride, a small etching rate of about 1000 Å/min in a prior art method using oxygen plasma can be considerably improved while suppressing temperature increase of the substrate and without generation of the etching residue.

Next, the third embodiment of the present invention applied with the dry etching method for the polyetheramide resin will be described in detail below.

In the third embodiment, at first, HIMAL HL-1200 (manufactured by Hitachi Kasei Kogyo) as the polyetheramide is coated on a substrate by means of a spinner. Then, the coated polyetheramide is subject to preliminary drying for 30 minutes at 90° C., and then to thorough drying at 250° C. so that a sample is produced to measure the etching rate of dry etching.

A film thickness is measured by means of an optical film thickness meter.

Measurement results of the etching rate are, shown in FIGS. 6 to 9.

Figure 6:
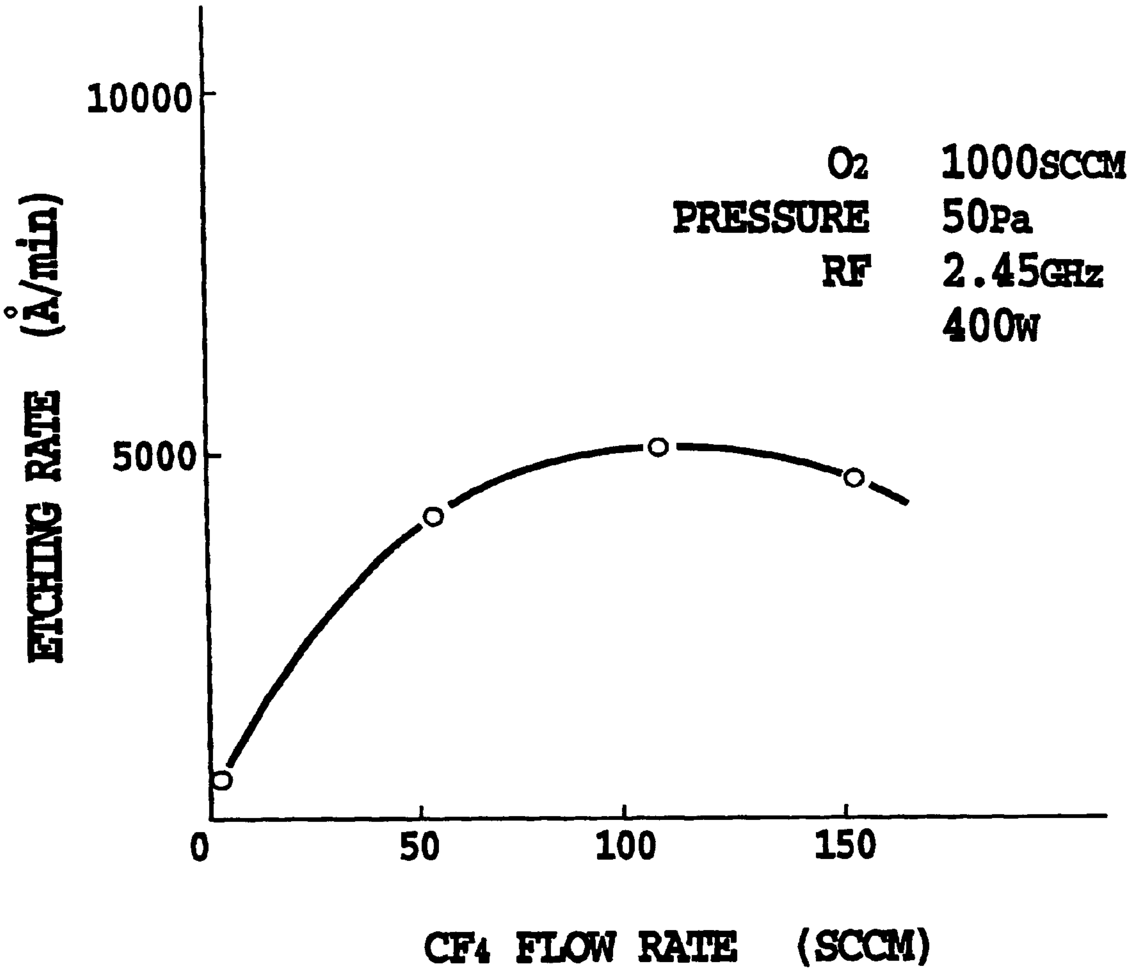
FIG. 6 is a diagram showing a relation between an etching rate and a gas composition when etching a polyetheramide in an etching apparatus of RF 2.45 GHz according to a third embodiment of the present invention.
Figure 7:
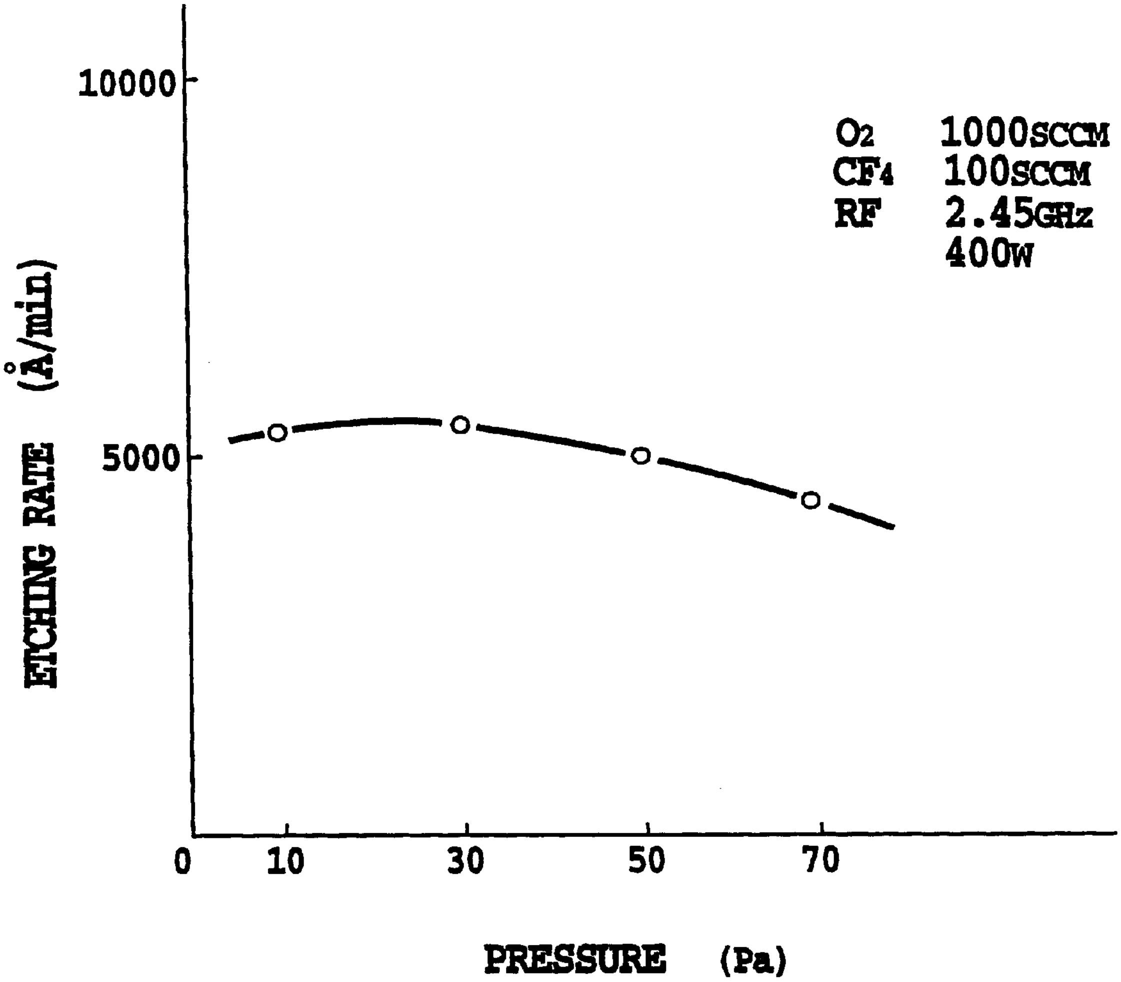
FIG. 7 is a diagram showing a relation between an etching rate and a pressure when etching a polyetheramide in the etching apparatus of RF 2.45 GHz according to the third embodiment of the present invention.
Figure 8:
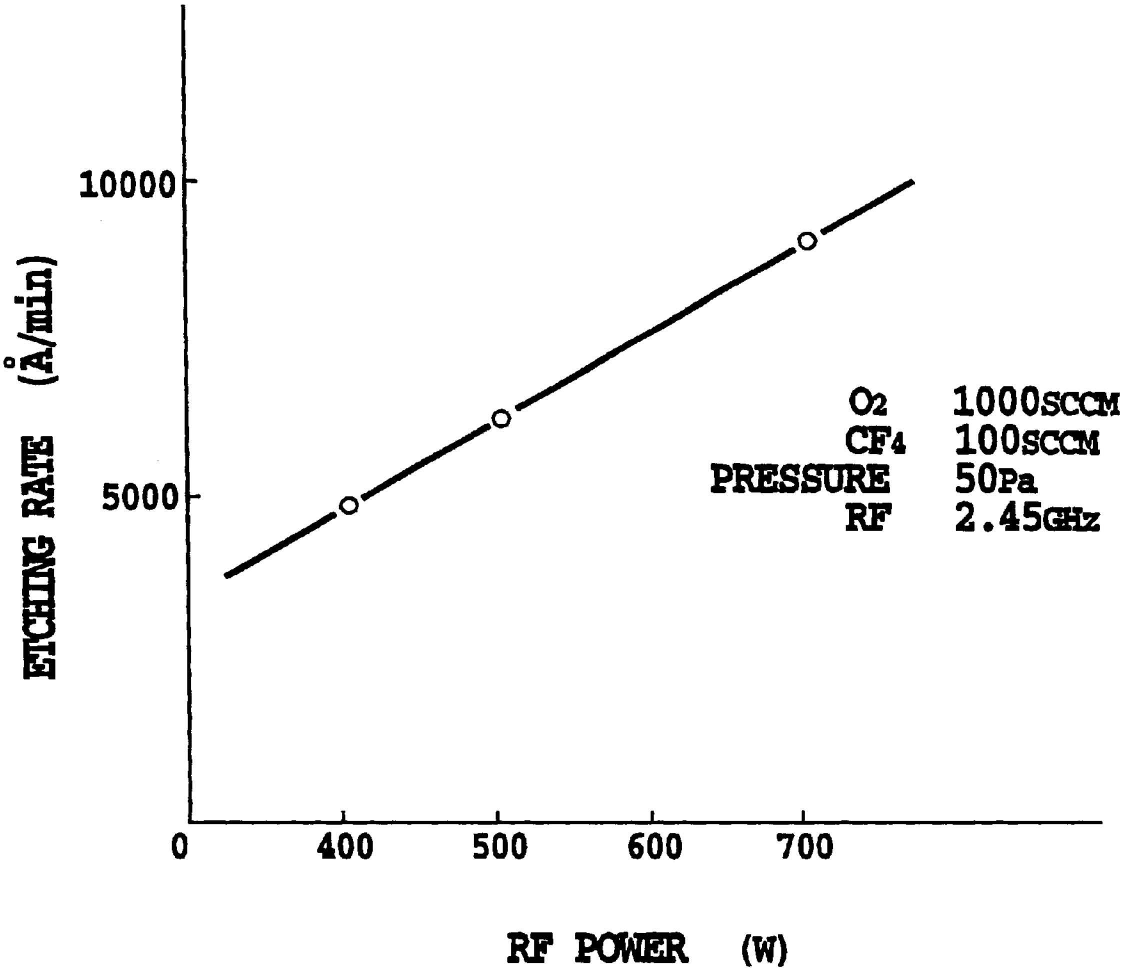
FIG. 8 is a diagram showing a relation between an etching rate and a RF power when etching a polyetheramide in the etching apparatus of RF 2.45 GHz according to the third embodiment of the present invention.
Figure 9:
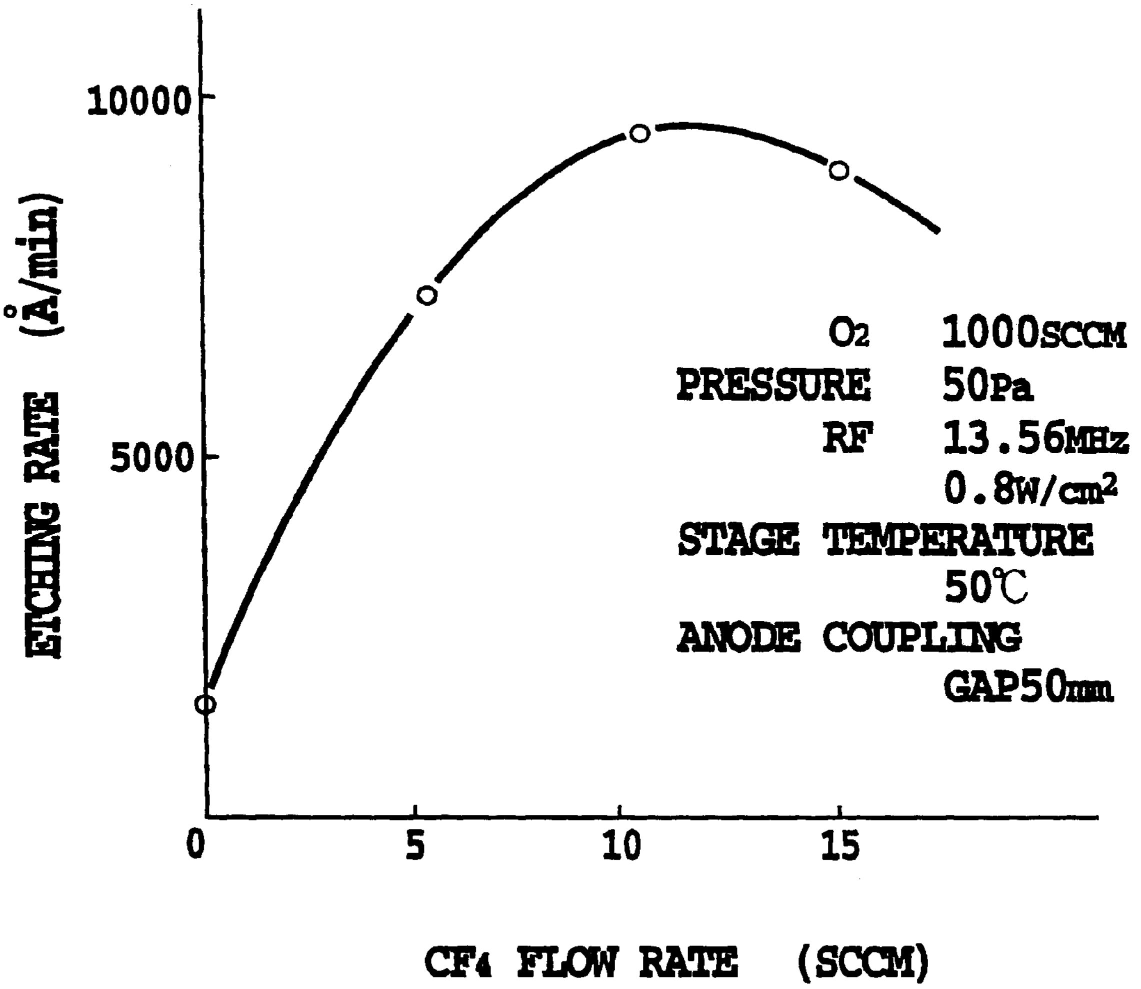
FIG. 9 is a diagram showing a relation between an etching rate and a gas composition when etching a polyetheramide in an etching apparatus of RF 13.56 MHz according to the third embodiment of the present invention.

FIGS. 6 to 8 show data obtained in case of using an etching apparatus of RF frequency of 2.46 GHz. FIG. 6 shows a relation between a gas composition and an etching rate, FIG. 7 shows a relation between pressure and the etching rate, and FIG. 8 shows a relation between an RF power and the etching rate. Further, FIG. 9 shows a relation between the gas composition and the etching rate in the case where an anode coupling type etching apparatus of the RF frequency of 13.56 MHz is used. It can be seen that an addition of $CF_4$ remarkably improves the etching rate.

As for the gas composition, an addition amount of $CF_4$ can be optionally varied. However, it is preferable to add at an amount of 2% or more to the $O_2$ flow rate in view of the etching rate and reduce of the residue. In case of increasing the amount of $CF_4$, since an underlying layer tends to be etched at an occurrence of overetching (in particular, an underlying layer of silicon, silicon oxide film, or a silicon nitride film is easily to be etched). Therefor, it is necessary to select the gas composition in consideration of the underlying layer.

Further, in the case of adding the $CF_4$ to excess, the etching rate becomes smaller than the gas of non-addition of $CF_4$, on the contrary. Therefor, it is preferable that the addition amount be within 30% to the oxygen flow rate. In particular, a range from 5% to 15% is especially preferable. As for a gas pressure, a stable condition is selected according to the characteristics of the apparatus. In general, it is in a range from 10 Pa to 300 Pa.

Also for the gas flow rate and the RF power, proper conditions are selected according to the characteristics of the apparatus. It should be noted that adding an inert gas such as nitrogen or the like may be added to the oxygen and the carbon tetrafluoride as the etching gas for stabilization of plasma and improvement of the etching rate.

Next, patterning for the mask is performed with use of a resist and the patterning characteristics are evaluated.

First, a silicon wafer (6 inches) is coated with HIMAL HL-1200 to a thickness of 2 μm and dried in the above condition, OFPR-800 (manufactured by Tokyo Ouka Kogyo) is used as a resist and patterning of the resist is performed. The film thickness of the resist is 5 μm.

As to etching conditions, an etching apparatus of RF frequency 2.46 Ghz is used in which an etching is performed by using an etching gas of $O_2$ 1000 sccm and $CF_4$ 100 sccm at a pressure of 50 Pa and a RF power of 500 W.

Also, the etching is performed to the same sample in an etching apparatus of RF frequency 13.56 MHz and 0.8 W/cm$^2$ by using an etching gas of $O_2$ 100 sccm and $CF_4$ 10 sccm at a pressure of 50 Pa and a stage temperature of 50° C.

As a result, the etching residue is not produced in both cases, sharp patterning is achieved and the resist is removed without causing any problem. The maximum temperatures of the substrates in these cases are 90° C. and 80° C., respectively.

Removing the resist is performed by using removing liquid 1112A (manufactured by Shipley) at room temperature while applying an ultrasonic wave.

Patterning accuracy is of −2 μm relative to the resist pattern width, obtaining a good result with a deviation of about ±10%.

Embodiment 4

A novolac-based positive photo-resist has been used as a mask for dry etching in view of dry etching resistance and fine processing ability, traditionally. The novolac-based positive resist is insufficient as an etching mask for a polyamide resin in terms of an etching selecting ratio (nearly the same etching rate as the polyamide resin). However, prior art photolithography can be used, as is, and increasing the film thickness covers up the above disadvantage. For example, when etching for a 2 μm thick polyamide, the novolac-based positive resist with a film thickness of about 5 μm to 8 μm has been used. In this case, a long time is required for exposure and development of the photo-resist to have a problem in productivity.

However, according to the etching mask of a silicon-containing photo-resist of the present embodiment, a high-quality fine liquid drop ink-jet printing head of any type of side shooter and edge shooter types can be fabricated with high productivity.

Further, the dry etching method for the polyetheramide resin according to the present invention, in which a silicon-containing photo-resist is used as the etching mask, may be applied to a dry etching apparatus using a plasma excitation method by means of microwave discharge of batch type (processing a plurality of sheets of substrates). This structure allows the patterning process to be remarkably improved in a productivity as compared with the prior art.

In the prior art, it has been known that there exists a loading effect in which the etching rate is varied with a number of processing sheets of substrates (processing area) when a plurality of sheets of substrates are similarly processed in the above-stated dry etching apparatus. Also when performing patterning for the polyetheramide resin by using the novolac type positive resist, the peak of etching rate is shifted by such a loading effect, and the loading effect is almost eliminated from an etching area of 5 inch wafers or less.

Such tendency of the loading effect is similarly noted in the case where the polyetheramide resin is dry etched by means of the gas mixture of oxygen and carbon tetrafluoride.

Figure 10:
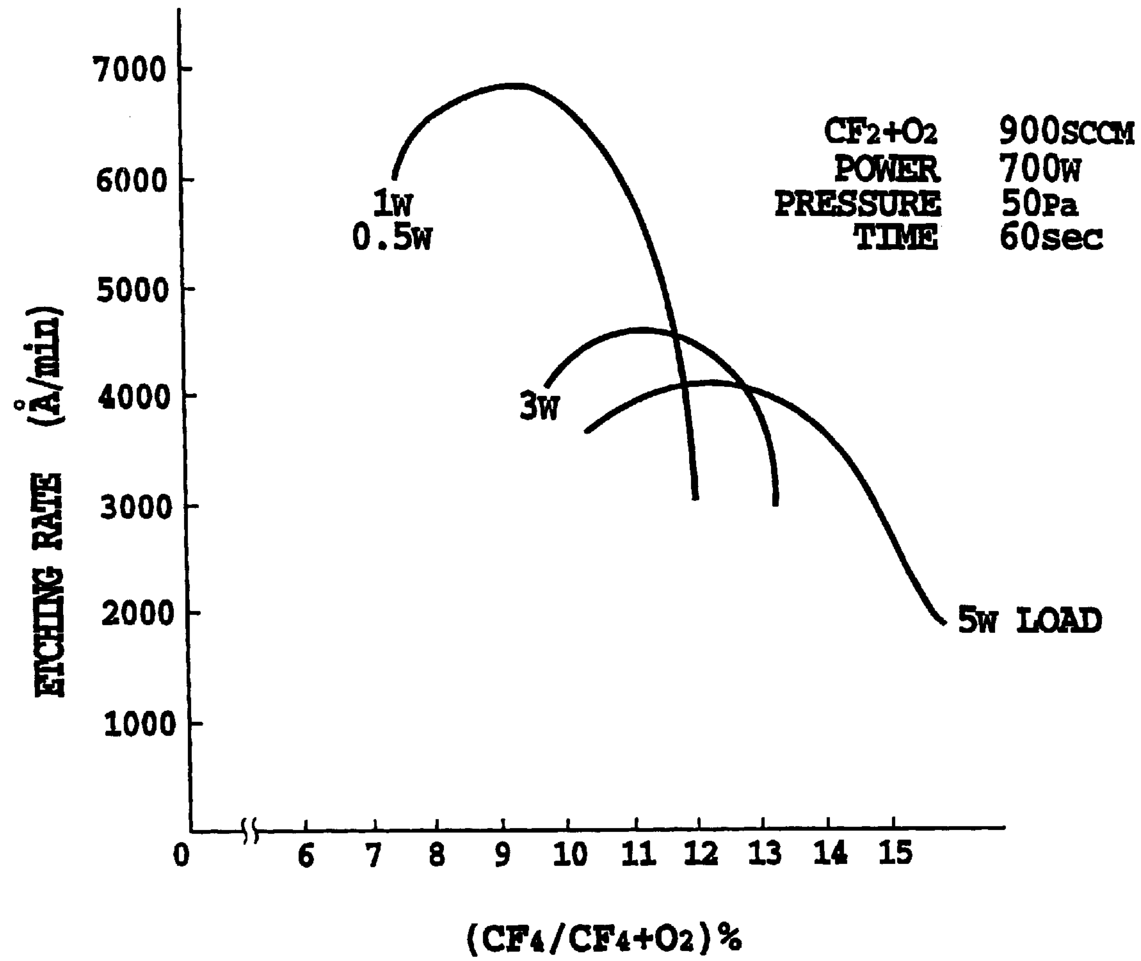
FIG. 10 is a diagram showing a result obtained by measuring a etching rate in which a 5 inch wafer which is coated with the polyetheramide resin (manufactured by Hitachi Kasei Kogyo, HIMAL HL-1200) and is baked is etched by using a batch-type dry etching apparatus CDE-7-4 (microwave power source) of Shibaura Seisakusho.

FIG. 10 is a diagram showing a result obtained when a 5 inch wafer is coated with the polyetheramide resin (HIMAL HL-1200 manufactured by Hitachi Kasei Kogyo) and baked, and measured for etching rate in a batch type dry etching apparatus CDE-7-4 (microwave power supply) of Shibaura Seisakusho.

Etching is performed for 1 minute, and the film thickness is measured by an optical method. As to the etching conditions, the total flow rate of $O_2$ and $CF_4$ is fixed to 900 sccm, and addition amount of $CF_4$ is varied. A power and a pressure are fixed at 700 W and 50 Pa, respectively. Wafer loading (processing amount per 1 batch) is varied among 0.5 W (wafer), 1 W, 3 W, and 5 W.

As can be seen from FIG. 10, there is a peak at a certain composition in each wafer loading. An etching rate decreases at the left side of the peak due to shortage of the carbon tetrafluoride, and at the right side of the peak, the etching rate decreases because the supply of the carbon tetrafluoride is in excess, on the contrary. Further, a location of the peak varies with a number of processing sheets of wafer.

Consequently, when performing etching for the polyetheramide resin in a batch type etching apparatus, it is necessary to deal with the etching process so that the number of processing sheets of wafer is adjusted by adding a dummy of the same type as the processing sheets, or the etching gas composition and etching time are changed depending on the number of processing sheets.

However, according to the dry etching method for the polyetheramide resin of the present invention, a silicon-containing photo-resist as an etching mask is used in a dry etching apparatus using a plasma excitation method by microwave discharge of batch type (processing a plurality of sheets). This arrangement can realize patterning process for the polyetheramide resin at a high throughput without employing means decreasing the productivity such as described above.

The present embodiment will be described in further detail. In the fourth embodiment, HIMAL HL-1200 (manufactured by Hitachi Kasei Kogyo) as the polyetheramide is coated by means of a spinner at a thickness of 2 μm, preliminary dried for 30 minutes at 90° C., and then thoroughly dried at 250° C. On the coated polyetheramide, for example, FH-SP (tradename) as the Si-containing resist manufactured by Fuji Hant Electronics Technology is coated by means of a spinner at a thickness of 1 μm, and then patterning process is performed in the following conditions.

| | |
|---|---|
| (1) Preliminary baking | Oven 90° C. × 20 min |
| (2) Exposure | PLA-600F (provided by Canon Inc) 400 mj/cm$^2$ |
| (3) Development | Tokyo Ouka positive resist developer NMD-3 dip at room temperature for 25 sec |
| (4) Rinsing | Pure water 1 min |
| (5) Drying | Rinser dryer |

The Si-containing resist includes an alkali-soluble silicone polymer as a polymer and a naphthoquinonediazide-based substance as a photosensitive material, and a Si content of the base polymer becomes about 20%. Basically, the Si-containing photo-resist can be processed, as is, by an ordinary novolac-type positive resist processing line, and therefor requires any new apparatus for etching.

In the case of prior art novolac-type positive resist, the etching rate is almost the same as the polyetheramide resin, and then the resist is coated at a thickness of 5 to 8 μm. Owing to this, the exposure time and the developing time are long so that there occures a problem in productivity. The use of the Si-containing resist allows the etching resistance to be remarkably improved and coating film thickness of 1 μm to be sufficient for the resist. Thus, the exposure time is reduced to ¼ and the developing time to ⅕ relative to that of the prior art and the patterning productivity is considerably improved.

Next, the etching is performed in the dry etching apparatus CDE-7-4 using microwave of Shibaura Seisakusho kabusikikaisha. The etching conditions are as follows.

| | |
|---|---|
| (1) Gas | $CF_4/O_2$ = 85 sccm/815 sccm |
| (2) Etching pressure | 50 Pa |
| (3) Power | 700 W (2.45 GHz) |
| (4) Time | 2 min |

Film loss after etching is at a level that does not cause problems at about 1 μm. Since the Si-containing photoresist is almost not etched, consumption of etching species at the resist part is small and therefore, to this extent, the etching rate for the polyetheramide is improved. Processing is completed in about ⅓ of the time required for the prior art resist. After completion of etching, the resist is removed, and the etching surface is observed by means of SEM. As a result of the observation, producing of spot-like fine residue is not observed, showing favorable etching.

When using the polyetheramide resin as a protective layer (for the case of small etching area) as in the present embodiment, an etching process with the same conditions for five wafers processing/one batch can be performed even for 1 sheet wafer to 4 sheets wafer processing. This is because the silicon-containing resist is almost not etched, and does not affect the etching characteristics as is the novolac-type positive resist and it is possible to perform etching of 1 to 5 sheets of wafer in the same condition.

The Si-containing photoresist includes a negative type resist other than the above. For example, there is SNR provided by Tohsoh kabushikikaisha (silicon-based negative-type resist).

Embodiment 5

A fifth embodiment of the present invention shows that the dry etching method shown in the above the fourth embodiment is applied to an ink-jet head.

In the present embodiment, a protective film as an ink-resistant layer made by the polyetheramide resin is formed on a substrate in the ink-jet head including a thermal action part formed with a heater part and a cavitation-resistant layer which are disposed on the substrate. In this case, for example, HIMAL HL-1200 (manufactured by Hitachi Kasei Kogyo) as the polyetheramide resin is coated at a thickness of 2 μm, patterning is performed by the method shown in the fourth embodiment, and an opening is formed by an etching in the protective layer disposed on the above-stated thermal action part. After the etching, the etched part is observed by means of SEM, and producing of a residue due to etching is not noted on the cavitation-resistant layer on which the thermal action part is formed.

Next, an ink ejection opening an amount of which is 8 pl and an ink supply port are formed. Then, observation on a bubble generation by the heater and on a ejection state and checking a printed result are performed. As a result, no abnormality that is considered to be caused by a residue particularly on the heater is observed.

In the above description, though the etching method of the present invention is described for the case of being applied particularly to ink-jet head, the present invention is not limited to the above embodiment, but can provide the same effect in the case of being applied to other etching.

As described above, according to embodiments of the present invention, for example, the polyetheramide resin layer is used as a mask for an etching in a substrate for constructing an ink-jet head, thereby defects such as pinholes generated in the mask during mask formation can be reduced.

Further, according to the embodiments of the present invention, use of a two-layered structure comprising the polyetheramide layer formed on a dielectric layer allows the above defects to be reduced and etching with a high accuracy to be performed in, for example, an anisotropic etching. As a result, the ink-jet head can be produced with high accuracy and high yield rate, thereby, providing a reliable, inexpensive ink-jet printing head.

Further, according to the etching method of the embodiments of the present invention, patterning polyetheramide resin layer can be performed at a high throughput and with a high accuracy, without producing of an etching residue while suppressing a substrate temperature increase.

Still further, in the dry etching method for the polyetheramide resin layer of the present invention, use of a silicon-containing photo-resist as an etching mask allows producing of a fine etching residue to be eliminated and productivity in the photolithographic processing to be improved.

Yet further, application of the silicon-containing photoresist as an etching mask to a dry etching apparatus using a plasma excitation method by microwave discharge of batch type (processing a plurality of sheets) causes productivity of patterning to be remarkably improved as compared with the prior art.

Therefore, the embodiments of the present invention can be applied in applications requiring fine patterning, such as a protective layer as an ink-resistant layer in an ink-jet printing head, a protective film in a thermal print head, or a protective film in a semiconductor device, while utilizing the characteristics of the polyetheramide resin, thereby, improving the reliability of these devices.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An etching method in which an etching-resistant mask having a predetermined opening pattern is provided on a substrate and etching is performed through said etching-resistant mask so as to process said substrate, wherein a polyetheramide resin layer is used as said etching-resistant mask.

2. An etching method as claimed in claim 1, wherein said etching-resistant mask has a two-layered structure comprising the polyetheramide resin layer and a dielectric layer and said polyetheramide layer is provided on said dielectric layer.

3. An etching method as claimed in claim 1, wherein said predetermined opening pattern on said polyetheramide resin layer as said etching-resistant mask is formed by dry etching using an etching gas containing oxygen as a main component.

4. An etching method as claimed in claim 1, wherein said predetermined opening pattern of said polyetheramide resin layer as said etching-resistant mask is formed by dry etching using an etching gas containing a mixture of oxygen and carbon tetrafluoride as main components.

5. An etching method as claimed in claim 1, wherein a silicon wafer is used as said substrate.

6. An etching method as claimed in claim 5, wherein said etching is an anisotropic etching.

7. A dry etching method for a polyetheramide resin layer, wherein said polyetheramide resin layer is etched by means of an etching gas containing oxygen as a main component.

8. A dry etching method for a polyetheramide resin layer, wherein said polyetheramide resin layer is etched by means of an etching gas containing oxygen and carbon tetrafluoride as main components.

9. A dry etching method as claimed in claims 7 or 8, wherein a silicon-containing photo-resist as an etching mask for a dry etching is employed.

10. A dry etching method for identically processing a plurality of objects by means of plasma excitation caused by microwave discharge, wherein said plurality of objects are etched by means of an etching method as claimed in claim 3.

11. An etching method used in the production of an ink-jet head for ejecting an ink, comprising the steps of:

providing a substrate for constructing said ink-jet head;

forming a mask pattern including a polyetheramide resin layer on a surface of said substrate; and performing etching with use of said mask pattern as a mask.

12. An etching method used in the production of an ink-jet head for ejecting an ink, comprising the steps of:

providing a substrate for constructing said ink-jet head;

forming a mask pattern including a two-layered structure of a polyetheramide resin layer formed on a dielectric layer, said two layered structure being formed on a surface of said substrate; and performing etching with use of said mask pattern as a mask.

13. An etching method as claimed in claims 11 or 12, wherein said mask pattern is formed by dry etching using an etching gas containing oxygen as a main component.

14. An etching method as claimed in claims 11 or 12, wherein said mask pattern is formed by dry etching using an etching gas containing a mixture of oxygen and carbon tetrafluoride as a main component.

15. An etching method as claimed in claim 14, wherein an ink supply port passing through said substrate is formed by said etching.

16. An etching method as claimed in claims 11 or 12, wherein a silicon wafer is used as said substrate.

17. An etching method as claimed in claims 11 or 12, wherein an electrothermal conversion element utilized for ejecting an ink and an ink flow passage member are formed on said substrate.

18. An etching method as claimed in claim 11, wherein said etching is an anisotropic etching.

19. An etching method used in the production of an ink-jet head for ejecting an ink, comprising the steps of:

providing a substrate for constructing an ink-jet head;

forming a protective film as an ink-resistant layer including a polyetheramide resin layer on a surface of said substrate; and processing said protective film by means of a dry etching method as claimed in claims 7 or 8.

20. An etching method as claimed in claim 19, wherein said protective film is formed on said substrate including at least a thermal action part, and an opening corresponding to said thermal action part is processed in said protective film by said dry etching.

21. An etched substrate used in the production of an ink-jet head produced by a method comprising the steps of:

providing a substrate for constructing the ink-jet head;

forming a mask pattern including a polyetheramide resin layer on a surface of said substrate; and performing etching with use of said mask pattern as a mask.

22. An etched substrate used in the production of an ink-jet head produced by a method comprising the steps of;

providing a substrate for constructing the ink-jet head;

forming a mask pattern including a two-layered structure in which a polyetheramide layer is formed on a dielectric layer; and performing etching with use of said mask pattern as a mask.

23. An etched substrate as claimed in claim 21 or 22, wherein said mask pattern is formed by a dry etching method for a polyetheramide resin layer, wherein said polyetheramide resin layer is etched by means of an etching gas containing oxygen as a main component.

24. An etched substrate as claimed in claims 21 or 22, wherein an ink supply port passing through said substrate is formed by said etching method.

25. An etched substrate as claimed in claims 21 or 22, wherein a silicon wafer is used as said substrate.

26. An etched substrate as claimed in claims 21 or 22, wherein an electrothermal conversion element utilized for ejecting ink and an ink flow passage member are formed on said substrate.

27. An etched substrate as claimed in claim 25, wherein said etching is an anisotropic etching.

28. An etched substrate used in the production of an ink-jet head produced by a method comprising the steps of:

providing a substrate for constructing the ink-jet head;

forming a protective film as an ink-resistant layer including a polyetheramide resin layer on a surface of said substrate; and processing said protective film by means of a dry etching method as claimed in claims 7 or 8.

29. An etched substrate as claimed in claim 28, wherein said protective film is formed on said substrate including at least a heater part, and an opening corresponding to said heater part is processed in said protective film by said dry etching.

30. An ink-jet printing apparatus for performing printing by ejecting ink, wherein an ink-jet head for ejecting an ink includes an etched substrate as claimed in claims 21 or 22.

31. An etched substrate as claimed in claim 21 or 22, wherein said mask pattern is formed by a dry etching method for a polyetheramide resin layer, wherein said polyetheramide resin layer is etched by means of an etching gas containing oxygen and carbon tetrafluoride as main components.

* * * * *